United States Patent
Camp, Jr. et al.

(10) Patent No.: US 6,194,963 B1
(45) Date of Patent: Feb. 27, 2001

(54) CIRCUIT AND METHOD FOR I/Q MODULATION WITH INDEPENDENT, HIGH EFFICIENCY AMPLITUDE MODULATION

(75) Inventors: William O. Camp, Jr., Chapel Hill; Jeffrey A. Schlang, Raleigh; Charles Gore, Durham; Ronald D. Boesch, Morrisville; Domenico Arpaia, Cary, all of NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/195,521

(22) Filed: Nov. 18, 1998

(51) Int. Cl.[7] ........................................ H03F 1/32
(52) U.S. Cl. ............................ 330/149; 332/145
(58) Field of Search .......................... 330/2, 129, 149; 375/297; 455/63, 126; 332/145

(56) References Cited

U.S. PATENT DOCUMENTS

| | | | |
|---|---|---|---|
| 4,462,001 | 7/1984 | Girard | 330/149 |
| 4,580,111 | 4/1986 | Swanson | 332/41 |
| 4,972,440 | * 11/1990 | Ernst et al. | 332/145 X |
| 4,985,688 | 1/1991 | Nagata | 332/123 |
| 5,105,445 | 4/1992 | Karam et al. | 375/60 |
| 5,123,031 | 6/1992 | Kuisma | 375/60 |
| 5,351,016 | 9/1994 | Dent | 332/103 |
| 5,420,536 | 5/1995 | Faulkner et al. | 330/149 |
| 5,430,416 | 7/1995 | Black et al. | 332/145 |
| 5,450,044 | 9/1995 | Hulick | 332/103 |
| 5,832,373 | * 11/1998 | Nakanishi et al. | 455/126 |
| 5,886,572 | * 3/1999 | Myers et al. | 330/149 X |

FOREIGN PATENT DOCUMENTS

| | | |
|---|---|---|
| 03265333 | 11/1991 | (EP) . |
| 2 173 074 | 3/1986 | (GB) . |

* cited by examiner

*Primary Examiner*—Steven J. Mottola
(74) *Attorney, Agent, or Firm*—Wood, Phillips, VanSanten, Clark & Mortimer

(57) ABSTRACT

An RF amplifier includes a phase modulator developing a phase modulated RF input signal to be transmitted. A power amplifier receives the RF input signal and amplifies the RF input signal to develop an RF output signal. An amplifier control is operatively associated with the phase modulator and the power amplifier. The amplifier control includes a memory for storing correction information correlating desired amplitude of the RF output signal relative to actual amplifier amplitude, and a control varies power amplifier supply voltage responsive to the correction information to linearize amplitude modulation in the power amplifier.

22 Claims, 1 Drawing Sheet

CIRCUIT AND METHOD FOR I/Q MODULATION WITH INDEPENDENT, HIGH EFFICIENCY AMPLITUDE MODULATION

FIELD OF THE INVENTION

This invention relates to RF amplifiers and, more particularly, to a circuit and method having I/Q modulation and independent amplitude modulation in a power amplifier.

BACKGROUND OF THE INVENTION

Radio frequency (RF) transmitters, such as used in cellular telephones, develop an RF signal to be transmitted through the air. Information is carried on the signal via some form of modulation such as frequency modulation, phase modulation, amplitude modulation, or a combination of these.

It may be desirable to create a modulated signal with both amplitude and phase modulation. With the necessity of developing small and lightweight devices, particularly cellular telephones, it is important that such amplifier circuits use a minimum of components. One way to satisfy this desire is to directly modulate an oscillator phase lock loop (PLL) to impart the phase modulation component directly on the signal and then to amplitude modulate the power amplifier stage connected to a voltage controlled oscillator/phase lock loop (VCO/PLL) combination with the amplitude component. VCO/PLL circuits exist that have sufficient bandwidth relative to the information bandwidth of the signal to cause the phase modulation to occur directly on the output signal without any up-conversion. It remains, however, to put an amplitude signal onto this phase modulated signal. This is preferably done in the power amplifier stage, as it will permit this stage to run at high efficiency in a non-linear mode. A difficulty might arise in that the information bandwidth of the individual phase modulation component of the signal is larger than that of the composite signal. For complex quadrature amplitude modulation (QAM) signals, the PLL loop bandwidth may not be sufficient to impart all of the phase modulation components of the spectrum.

Previously, the above problem has been solved by direct I/Q modulation of the RF signal applying both amplitude and phase modulation to the RF signal. This requires a linear power amplifier to follow the I/Q modulator. A problem with the linear power amplifier is that it has an efficiency only in the range of thirty to forty percent and generates more heat than power.

The present invention is directed to overcoming one or more of the problems discussed above in a novel and simple manner.

SUMMARY OF THE INVENTION

In accordance with the invention there is provided a circuit and method independently controlling amplitude and phase modulation in an RF amplifier circuit.

Broadly, there is disclosed herein an RF amplifier including a phase modulator developing a phase modulated RF input signal to be transmitted. A power amplifier receives the RF input signal and amplifies the RF input signal to develop an RF output signal. An amplifier control is operatively associated with the the power amplifier. The amplifier control includes means for developing a control signal representing a desired amplitude of the RF output signal. Memory means store correction information correlating actual amplitude of the RF output signal relative to the control signal. Control means vary the power amplifier supply voltage using the control signal modified responsive to the correction information for the desired amplitude.

It is a feature of the invention that the phase modulator comprises an I/Q modulator. The phase modulator has no amplitude modulation.

It is another feature of the invention that the amplifier control comprises a processor.

It is still another feature of the invention that the memory means stores a transfer curve of the power amplifier RF output signal relative to the control signal.

It is still another feature of the invention to provide means coupled to the amplifier control for monitoring the RF output signal. The amplifier control periodically updates the correction information using the monitored RF output signal.

It is still another feature of the invention that the control means comprises a switching regulator developing the power amplifier supply voltage. Alternatively, the control means comprises a delta-sigma modulator, Class D amplifier stage and a low pass filter developing the power amplifier circuit supply voltage.

It is still a further feature of the invention that the control means comprises a programmed processor controlling the phase modulator. The phase modulator uses a high speed phase lock loop (PLL). The PLL includes a voltage-controlled oscillator (VCO) and a divider in a control loop for the VCO and the processor, in the form of a delta-sigma modulator, controls the divider integer to set channel frequency.

In accordance with another aspect of the invention an RF amplifier includes an I/Q modulator developing a phase modulated RF input signal to be transmitted. A power amplifier receives the RF input signal and amplifies the RF input signal to develop an RF output signal. An amplifier control is operatively associated with the I/Q modulator and the power amplifier, the amplifier control driving the I/Q modulator to impart phase modulation and varying the power amplifier supply voltage to linearize amplitude modulation in the power amplifier circuit.

In accordance with a further aspect of the invention there is disclosed the method of linearizing amplitude modulation in a power amplifier of an amplifier circuit comprising the steps of developing a phase modulated RF input signal to be transmitted, a power amplifier receiving the RF input signal and amplifying the RF input signal to develop an RF output signal, storing correction information correlating actual amplitude of the RF output signal relative to an amplifier control signal, and varying the power amplifier supply voltage using the amplitude control signal modified responsive to the correction information for the desired amplitude.

Further features and advantages of the invention will be readily apparent from the specification and from the drawing.

DETAILED DESCRIPTION OF THE INVENTION

Figure 1:
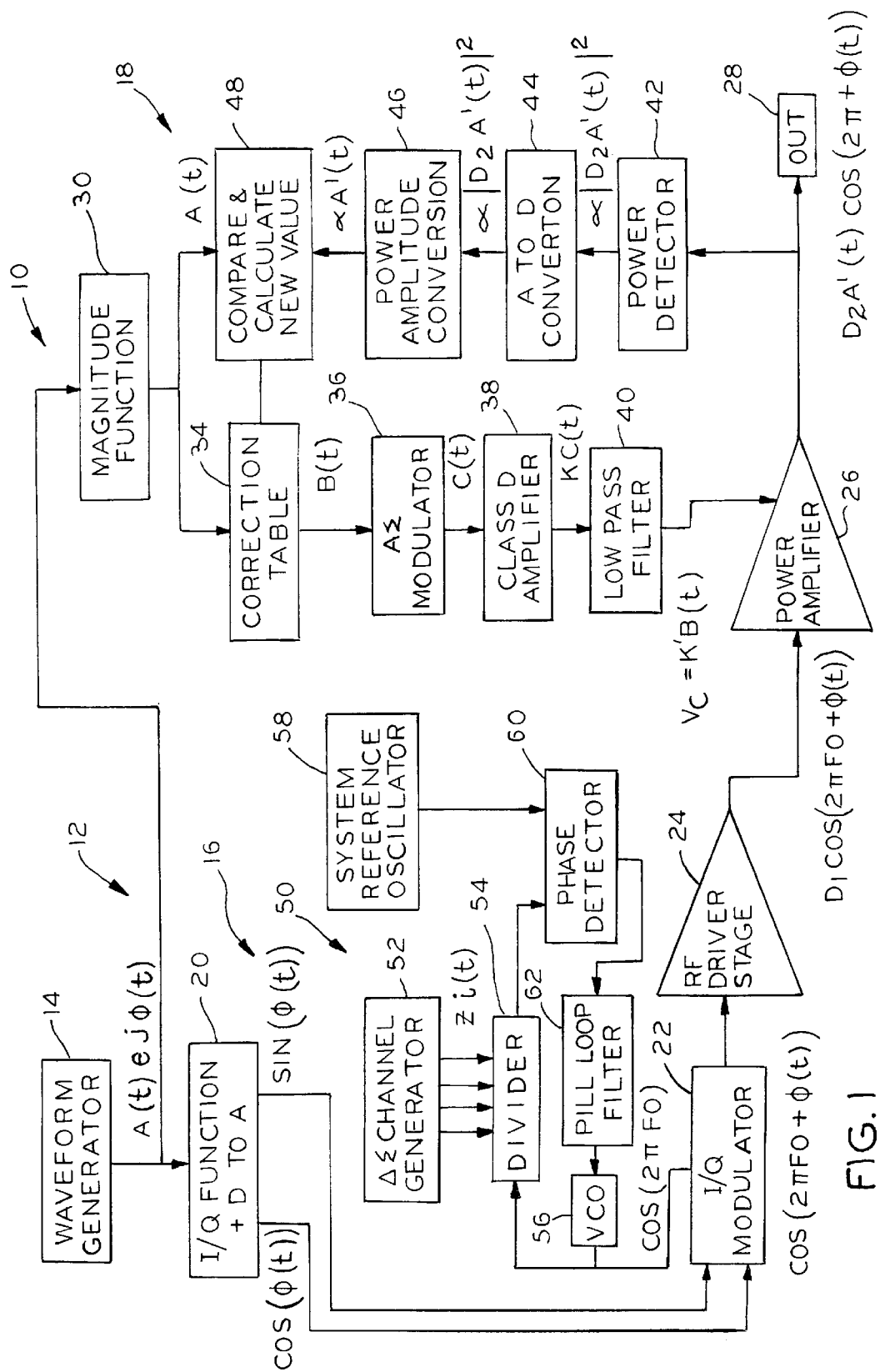
FIG. 1 is a block diagram illustrating an amplifier circuit according to the invention.

Referring to FIG. 1, a transmitter 10 which uses an RF amplifier circuit 12 according to the invention is illustrated. The transmitter 10 may be a device that transmits an RF signal through the air such as in a mobile cellular telephone or the like. More generally, the transmitter 10 may be utilized in any device which creates a modulated signal with both amplitude and phase modulation. The invention is particularly directed to a circuit and method to use in-phase and quadrature channel (I/Q) phase modulation in a transmitter with independent, high efficiency amplitude modulation. The amplifier circuit 12 learns a transfer curve of a power amplifier RF signal amplitude output versus supply voltage control signal to linearize amplitude modulation, as described more particularly below.

In the illustrated embodiment of the invention, the transmitter 10 utilizes a digital signal processor (DSP) and related circuitry for developing the output signal to be transmitted. As will be apparent, the circuit functions could be implemented in an ASIC, a programmed DSP, or a programmed microprocessor, or other similar type device.

The transmitter 10 includes a waveform generator 14. The waveform generator 14 creates the total modulation, including amplitude and phase, appropriate to the digital data being transmitted and the modulation characteristics. The RF amplifier circuit 12 receives the waveform and delivers it to a phase modulation path 16 and an amplitude modulation path 18.

The phase modulation path 16 includes an I/Q function 20. This is a mathematical function that converts the mathematical modulation waveform into mathematical sine and cosine of the phase versus time of the modulation waveform. The combination of the sine and cosine of the phase has a constant amplitude and varies only in phase. The function block 20 also converts the format from digital to analog. The sine and cosine signals are then applied to two modulation ports of an I/Q modulator 22. The I/Q modulator 22 varies only the phase of a continuous wave RF signal, as described further below.

The output of the I/Q modulator 22 is amplified by an RF driver stage 24. The RF driver stage 24 supplies sufficient signal level to a power amplifier 26 so that it is overdriven. The output of the power amplifier 26 is an output of the transmitter represented at a block 28.

The amplitude modulation path 18 includes a magnitude function 30 to create an amplitude modulation control signal A(t) representing a desired amplitude of the RF output signal. Various implementations and methods could be used to create this signal. This signal must be time synchronized with the I/Q function 20 such that the net effect through the amplifier circuit 12 is to create the desired composite signal at the output 28.

In the amplitude modulation path 18, the control signal from the magnitude function 30 is applied to a correction table 34. The correction table 34 is stored in a suitable memory of the amplifier circuit associated with the DSP. The memory stores a transfer curve of the power amplifier RF signal amplitude output versus the control signal. Particularly, the correction table 34 modifies the value of the desired amplitude to an amplitude that, when applied to the system, results in the correct amplitude of the RF signal out. The modified control signal is applied to a modulator 36 that creates a sequence of one bit digital signals whose average mimics the input waveform. Any pulse density modulator could be used. However, a delta-sigma modulator has the advantage that its noise versus frequency is low at low frequencies and high at high frequencies. A Class D amplifier stage 38 boosts the current capacity of the modulated signal as its output is either the full battery voltage or zero, depending on the binary state of the signal input to the modulator 36. The amplified signal is applied through a low pass filter 40 with the smooth voltage being connected to the drain or collector of the power amplifier 26. Thus, when empowered by the power amplifier 26 on the RF signal from the I/Q modulator 22, the final output signal is the original waveform created by the waveform generator 14 but now on an RF carrier signal at frequency $f_0$.

To maintain a faithful reproduction of the signal from the waveform generator 14 to the output 28, it is necessary to continually correct for non-linearities in the amplitude modulation process. The power level at the output of the power amplifier 26 is measured with a power detector circuit 42. The power signal is sampled at an analog-to-digital converter 44. A conversion block 46 converts the power level to amplitude by taking the square root and scaling it to the appropriate level with a constant so that it can be compared with the desired amplitude at a block 48. Particularly, the block 48 compares the desired amplitude from the block 30 and the measured amplitude from the block 46 and a new correction value is calculated for the particular level of the desired amplitude. The new value is inserted in the correction table at the block 34 if it is sufficiently different from the prior stored value for that specific value of the control signal A(t).

The correction table at the block 34 is maintained over varying conditions of temperature, power amplifier loading, battery voltage, etc. The maintenance of the correction table in the block 34 is easily done at a very low sampling rate.

Returning to the phase modulation path 16, the continuous wave signal supplied to the I/Q modulator 22 is developed by a combination voltage-controlled oscillator (VCO)/phase locked loop (PLL) function 50. A delta-sigma modulator or channel generator 52 develops a set of binary control signals $Z_{i(t)}$ to control the divisor number of a frequency divider 54. The divider 54 receives an output of a VCO 56. The divider 54 covers a large range under the control of the delta-sigma modulator 52. This creates a highly fractional N division at a very low divider number. Thus, the reference frequency of the VCO/PLL 50 is kept high and the loop frequency is also kept high. The divisor ratio sets the character frequency of the VCO 56. A system reference oscillator 58, phase detector 60, and PLL filter 62, along with the oscillator 56 and divider 54 make up a phase lock loop source that creates the continuous wave signal modulated by the I/Q modulator 22.

The advantage of using this VCO/PLL configuration is that the loop bandwidth is significantly higher and encompasses that necessary to pass the phase modulation frequency components.

As will be appreciated by one of ordinary skill in the art, the present invention may be embodied as methods or devices. Accordingly, the present invention may take the form of an entirely hardware embodiment, an entirely software embodiment, or an embodiment combining hardware and software aspects. The present invention has been described with respect to the block diagram illustrations of FIG. 1. It will be understood that many of the blocks can be implemented by computer program instructions. These program instructions, which represent steps, may be provided to a processor to produce a machine.

Accordingly, blocks of the illustration support combinations of means for performing the specified functions in combinations of steps for performing the specified functions. It will be understood that each block of the illustrations, and combinations of blocks in the illustrations, can be implemented by special purpose hardware-based systems which perform the specified functions or steps, or combinations of special purpose hardware and computer instructions.

Thus, in accordance with the invention, there is disclosed a transmitter amplifier circuit independently controlling an I/Q modulator and a power amplifier to provide independent, high efficiency amplitude modulation.

We claim:

1. An RF amplifier comprising:
a phase modulator developing a phase modulated RF input signal to be transmitted, wherein the phase modulator has no amplitude modulation;
a power amplifier receiving the RF input signal and amplifying the RF input signal to develop an RF output signal; and
an amplifier control operatively associated with the phase modulator and the power amplifier, the amplifier control including means for developing a control signal representing a desired amplitude of the RF output signal, memory means storing correction information correlating actual amplitude of the RF output signal relative to the control signal and control means for varying the power amplifier supply voltage using the control signal modified responsive to the correction information to the desired amplitude.

2. The RF amplifier of claim 1 wherein the amplifier control comprises a processor.

3. The RF amplifier of claim 1 wherein the memory means stores a transfer curve of the power amplifier RF output signal relative to the control signal.

4. An RF amplifier comprising:
a phase modulator developing a phase modulated RF input signal to be transmitted;
a power amplifier receiving the RF input signal and amplifying the RF input signal to develop an RF output signal;
an amplifier control operatively associated with the phase modulator and the power amplifier the amplifier control including means for developing a control signal representing a desired amplitude of the RF output signal, memory means storing correction information correlating actual amplitude of the RF output signal relative to the control signal and control means for varying the power amplifier supply voltage using the control signal modified responsive to the correction information to the desired amplitude; and
means coupled to the amplifier control for monitoring the RF output signal.

5. The RF amplifier of claim 4 wherein the amplifier control periodically updates the correction information using the monitored RF output signal.

6. An RF amplifier comprising:
a phase modulator developing a phase modulated RF input signal to be transmitted;
a power amplifier receiving the RF input signal and amplifying the RF input signal to develop an RF output signal; and
an amplifier control operatively associated with the phase modulator and the power amplifier, the amplifier control including means for developing a control signal representing a desired amplitude of the RF output signal, memory means storing correction information correlating actual amplitude of the RF output signal relative to the control signal and control means for varying the power amplifier supple voltage using the control signal modified responsive to the correction information to the desired amplitude wherein the control means comprises a switching regulator developing the power amplifier supply voltage.

7. An RF amplifier comprising:
a phase modulator developing a phase modulated RF input signal to be transmitted;
a power amplifier receiving the RF input signal and amplifying the RF input signal to develop an RF output signal; and
an amplifier control operatively associated with the phase modulator and the power amplifier, the amplifier control including means for developing a control signal representing a desired amplitude of the RF output signal, memory means storing correction information correlating actual amplitude of the RF output signal relative to the control signal and control means for varying the power amplifier supply voltage using the control signal modified responsive to the correction information to the desired amplitude wherein the control means comprises a delta-sigma modulator, a class D stage and a low pass filter developing the power amplifier supply voltage.

8. An RF amplifier comprising:
a phase modulator developing a phase modulated RF input signal to be transmitted;
a power amplifier receiving the RF input signal and amplifying the RF input signal to develop an RF output signal; and
an amplifier control operatively associated with the phase modulator and the power amplifier, the amplifier control including means for developing a control signal representing a desired amplitude of the RF output signal, memory means storing correction information correlating actual amplitude of the RF output signal relative to the control signal and control means for varying the power amplifier supply voltage using the control signal modified responsive to the correction information to the desired amplitude wherein the control means comprises a programmed processor controlling the phase modulator.

9. The RF amplifier of claim 8 wherein the phase modulator comprises an I/Q modulator.

10. The RF amplifier of claim 9 wherein the source of the RF signal to the phase modulator comprises a high speed phase locked loop (PLL) and a voltage-controlled oscillator (VCO).

11. An RF amplifier comprising:
a phase modulator, comprising and I/O modulator, developing a phase modulated RF input signal to be transmitted, wherein the source of the RF signal to the phase modulator comprises a high speed phase locked loop (PLL) and a voltage-controlled oscillator (VCO);
a power amplifier receiving the RF input signal and amplifying the RF input signal to develop an RF output signal; and
an amplifier control operatively associated with the phase modulator and the power amplifier, the amplifier control including means for developing a control signal representing a desired amplitude of the RF output signal, memory means storing correction information correlating actual amplitude of the RF output signal relative to the control signal and control means for varying the power amplifier supply voltage using the control signal modified responsive to the correction information to the desired amplitude, wherein the control means comprises a programmed processor controlling the phase modulator;
wherein the PLL has a divider in a control loop for the VCO and the processor controls the divider integer to set channel frequency.

12. An RF amplifier comprising:

an I/Q modulator developing a phase modulated RF input signal to be transmitted, wherein the I/Q modulator has no amplitude modulation;

a power amplifier receiving the RF input signal and amplifying the RF input signal to develop an RF output signal;

an amplifier control operatively associated with the I/Q modulator and the power amplifier, the amplifier control driving the I/Q modulator to impart phase modulation and varying the power amplifier supply voltage to linearize amplitude modulation in the power amplifier.

13. The RF amplifier of claim 12 wherein the amplifier control comprises a processor having memory means for storing a transfer curve of the power amplifier RF output signal relative to supply voltage.

14. The method of linearizing amplitude modulation in avower amplifier of an amplifier circuit comprising the steps of:

providing an I/Q modulator for developing a phase modulated RF input signal to be transmitted;

a power amplifier receiving the RF input signal and amplifying the RF input signal to develop an RF output signal;

storing correction information correlating actual amplitude of the RF output signal relative to an amplifier control signal; and varying power amplifier supply voltage using the amplitude control signal modified responsive to the correction information for the desired amplitude.

15. The method of claim 14 wherein the storing step comprises storing a transfer curve of the power amplifier RF output signal relative to supply voltage.

16. The method of linearizing amplitude modulation in a power amplifier of an amplifier circuit comprising the steps of:

developing a phase modulated RF input signal to be transmitted;

a power amplifier receiving the RF input signal and amplifying the RF input signal to develop an RF output signal;

storing correction information correlating actual amplitude of the RF output signal relative to an amplifier control signal;

varying power amplifier supply voltage using the amplitude control signal modified responsive to the correction information for the desired amplitude; and monitoring the RF output signal.

17. The method of claim 16 further comprising the step of periodically updating the correction information using the monitored RF output signal.

18. The method of linearizing amplitude modulation in a power amplifier of an amplifier circuit comprising the steps of:

developing a phase modulated RF input signal to be transmitted;

a power amplifier receiving the RF input signal and amplifying the RF input signal to develop an RF output signal;

storing correction information correlating actual amplitude of the RF output signal relative to an amplifier control signal; and varying power amplifier supply voltage using the amplitude control signal modified responsive to the correction information for the desired amplitude, wherein the varying step comprises developing a control signal to a switching regulator developing the power amplifier circuit supply voltage.

19. The method of linearizing amplitude modulation in a power amplifier of an amplifier circuit comprising the steps of:

developing a phase modulated RF input signal to be transmitted;

a power amplifier receiving the RF input signal and amplifying the RF input signal to develop an RF output signal;

storing correction information correlating actual amplitude of the RF output signal relative to an amplifier control signal; and varying power amplifier supply voltage using the amplitude control signal modified responsive to the correction information for the desired amplitude, wherein the varying step comprises developing a control signal to a class D stage developing the power amplifier circuit supply voltage.

20. The method of claim 14 wherein the developing step comprises operating a programmed processor circuit to control the phase modulation.

21. The method of claim 20 further comprising wherein the I/Q modulator comprises a high speed phase locked loop (PLL).

22. The method of linearizing amplitude modulation in a power amplifier of an amplifier circuit comprising the steps of:

developing a phase modulated RF input signal to be transmitted;

a power amplifier receiving the RF input signal and amplifying the RF input signal to develop an RF output signal;

storing correction information correlating actual amplitude of the RF output signal relative to an amplifier control signal; and varying power amplifier supply voltage using the amplitude control signal modified responsive to the correction information for the desired amplitude, wherein the developing step comprises operating a programmed processor circuit to control the phase modulation circuit wherein the phase modulation circuit comprises a high speed phase locked loop (PLL), and wherein the PLL includes a voltage-controlled oscillator (VCO) and a divider in a control loop for the VCO and the operating step comprises controlling the processor circuit to control the divider integer.

* * * * *